United States Patent
Tseng et al.

(10) Patent No.: US 9,933,998 B2
(45) Date of Patent: Apr. 3, 2018

(54) METHODS AND APPARATUSES FOR PERFORMING MULTIPLICATION

(71) Applicants: Kuo-Tseng Tseng, San Jose, CA (US); Parkson Wong, Los Altos, CA (US)

(72) Inventors: Kuo-Tseng Tseng, San Jose, CA (US); Parkson Wong, Los Altos, CA (US)

(73) Assignees: Kuo-Tseng Tseng, San Jose, CA (US); Parkson Wong, Los Altos, CA (US)

( * ) Notice: Subject to any disclaimer, the term of this patent is extended or adjusted under 35 U.S.C. 154(b) by 65 days.

(21) Appl. No.: 15/424,929

(22) Filed: Feb. 6, 2017

(65) Prior Publication Data

US 2017/0168775 A1    Jun. 15, 2017

Related U.S. Application Data

(63) Continuation-in-part of application No. 14/557,368, filed on Dec. 1, 2014, now abandoned.

(Continued)

(51) Int. Cl.
*G06F 7/487* (2006.01)
*G06F 7/483* (2006.01)
(Continued)

(52) U.S. Cl.
CPC .......... *G06F 7/4876* (2013.01); *G06F 7/4824* (2013.01); *G06F 7/4833* (2013.01); *G06F 7/5306* (2013.01); *H03K 19/20* (2013.01)

(58) Field of Classification Search
CPC ...... G06F 7/523; G06F 7/5272; G06F 7/5275; G06F 7/5277; G06F 7/5306–7/5318; G06F 7/533; G06F 7/5334

(Continued)

(56) References Cited

U.S. PATENT DOCUMENTS 4,831,571 A * 5/1989 Tokumaru ............... G06F 5/015
                                                    708/209
5,255,216 A * 10/1993 Blanz .................... G06F 7/5324
                                                    708/620

(Continued)

OTHER PUBLICATIONS

N. Brisebarre, F. de Dinechin, and J.-M. Muller, "Integer and floating-point constant multipliers for FPGAs", In Application-specific Systems, Architectures and Processors, pp. 239-244, 2008.*

(Continued)

*Primary Examiner* — Matthew Sandifer

(57) ABSTRACT

In a novel computation device, a plurality of partial product generators is communicatively coupled to a binary number multiplier. The binary number is partitioned in the computation device into non-overlapping subsets of binary bits and each subset is coupled to one of the plurality of partial product generators. Each partial product generator, upon receiving a subset of binary bits representing a number, generates a multiplication product of the number and a predetermined constant. The multiplication products from all partial product generators are summed to generate the final product between the predetermined constant and the binary number. The partial product generators are constructed by logic gates and wires connected the logic gates including a AND gate. The partial product generators are free of memory elements.

5 Claims, 8 Drawing Sheets

Related U.S. Application Data

(60) Provisional application No. 61/910,509, filed on Dec. 2, 2013.

(51) Int. Cl.
    *G06F 7/53*     (2006.01)
    *G06F 7/48*     (2006.01)
    *H03K 19/20*     (2006.01)

(58) Field of Classification Search
    USPC .......................... 708/503, 620, 625, 628–630
    See application file for complete search history.

(56) References Cited

U.S. PATENT DOCUMENTS

| | | | | |
|---|---|---|---|---|
| 6,006,244 A * | 12/1999 | Mahurin | ................ | G06F 7/762 708/209 |
| 6,223,197 B1 * | 4/2001 | Kosugi | ................ | G06F 7/523 708/620 |
| 7,912,891 B2 * | 3/2011 | Cho | ................ | G06F 7/533 708/620 |
| 8,046,401 B2 * | 10/2011 | Pu | ................ | G06F 7/5332 708/620 |
| 8,843,541 B1 * | 9/2014 | Old | ................ | G06F 7/5324 708/490 |
| 2003/0065699 A1 * | 4/2003 | Burns | ................ | G06F 7/5324 708/625 |
| 2006/0230094 A1 * | 10/2006 | Simkins | ................ | G06F 7/02 708/625 |

OTHER PUBLICATIONS

W. K. Luk, J. E. Vuillemin, E. J. Aas, "Recursive implementation of optimal time VLSI integer multipliers", Proc. VLSI 1983, pp. 155-168, 1983.*

W. K. Luk, "A regular layout for parallel multiplier of 0(log2N) time", CMU Conference on VLSI Systems and Computations, pp. 317-326, 1981.*

* cited by examiner

METHODS AND APPARATUSES FOR PERFORMING MULTIPLICATION

BACKGROUND

Multiplication is a fundamental arithmetic operation one can do with pen and paper and with computer. How to do it fast and with high accuracy has been a subject of intense research in the art of computer science and engineering.

Multiplication involves two operands—the multiplicand and the multiplier. Traditionally one performs multiplication in three steps: first one multiplies the digits of the multiplier sequentially to the multiplicand digit by digit to generate partial products. Next, one aligns the partial products by properly "shifts" them according to the position of the digits in the multiplier. Finally one "adds" the partial products to arrive at the final product.

Pen-on-paper is viable when the operands are simple, but it becomes only practical to use a computer or other electronic computational devices when they are not, especially when calculation speed and accuracy are important.

Even though the "add and shift" algorithm is straight forward, its implementation in a traditional electronic computer may involve a fair amount of hardware components and still takes lengthy machine time to execute the necessary steps when the operands are non-trivial such s irrational numbers and when high accuracy is required.

Computer scientists and engineers have endeavored to speed up the operation. For example, Andrew Donald Booth published an important work in 1951 directed to a multiplication algorithm suitable for machine implementation. It has been followed and expanded ever since. The following is a brief account of the Booth's algorithm commonly known as Booth 2 is presented below for illustrative purposes.

First, the multiplier is partitioned and decoded into overlapping groups of 3-bit binary numbers, which may be stored in a memory unit. When the multiplicand then arrives at the computing unit, it is multiplied by each of the 3-bit multiplier groups in succession and the resulting partial products are stored, for example, also in a memory unit. All partial products then go through the "shifted and aligned" in a binary adder and are manipulated there to arrive at the final product of the multiplication.

Comparing to the rudimentary digit-by-digit approach, the Booth 2 method reduces the number of partial products by almost, a half, or more precisely, from n to (n+2)/2, where n is the multiplier in binary bits. Other versions of the Booth's algorithm, such as Booth 3, Booth 4, and Redundant Booth are known in the art. These successively sophisticated algorithms incrementally improve the speed of multiplication.

In 1991 Wolf-Ekkehard Blanz et al. of IBM proposed a method for multiplying an N bit number X by an M bit number C. With this method, the N bit number is partitioned into K non-overlapping bit groups. Each bit group functions as an address for accessing a look-up-table (LUT). The values from the LUT represent a sum of a constant and the product of the M bit number C and the binary value of the bit group to which the LUT corresponds. The values are added together after bit shifted in accordance with their relative priorities in an adder until to arrive at a single result, which is the (N+M) bit product of C and X. Many later works adopted the LUT approach with further improvements.

Definition of Several Terms

The terms used in this disclosure generally have their ordinary meanings in the art within the context of the invention. Several terms are further discussed below to provide additional guidance to the practitioners regarding the description of the invention. It will be appreciated that same thing can be said in more than one way. Consequently, alternative language and synonyms may be used.

Binary Number In the context of this paper, a binary number is a number expressed in base 2 numeral system, which represents numeric values using 0 (zero) and (one). The base 2 system is a positional notation with a radix of 4.

Constant In the context of this paper, a constant refers to a number that is assumed not to change its value throughout a given mathematical operation. Constants include integers ratios of fractions, and irrational numbers such as $\pi$, ln 2.

Non-overlapping In operations involving numbers of multiple digits, such as multiplication, the digits may be grouped into sets or subsets. In the context of this paper, non-overlapping refers to grouping of digits where each digit does not appear in more than one set, as contrasting to in the Booth algorithms.

Aggregated, Adjacent, Separate, Distributed, and Disjoined In the context of integrated circuit chip layout, functional circuit blocks such partial product generators are placed based on the consideration of chip real estate efficiency and chip performance. Similar circuit blocks that are composed of similar circuit components and that perform similar electrical functions may be grouped together and placed in location on the chip in a one or two dimensional array configuration. In such a configuration, the circuit blocks are said to be aggregated and, are adjacent to each other. In some designs, when considerations such as speed take a higher priority, the function blocks may be placed separated to be closer to certain functional blocks and therefore are said to be distributed in disjoined locations and are not adjacent to one another.

Partial Product Generator (PPG) In the context of this paper, a partial product generator refers to a function block in a device that performs, among other tasks, multiplications of numbers. When, during the multiplication operation, only a portion of either the multiplier or the multiplicand or both are involved in the multiplication in the function block, the function block is referred to as a partial product generator because the product is only a part of the final result.

Logic Gates In the context of this paper, logic gates are elementary function blocks of digital circuits. Logic gates have input and output terminals. During operation, the terminals are in one of the two binary states low (0) or high (1), represented by different voltage levels. The logic state of a terminal changes as the circuit processes data. There are seven basic logic gates: AND, OR, XOR, NOT, NAND, NOR, and XNOR. The time a bit passes from the input terminal of a logic gate to the output terminal is referred as the gate delay of the logic gate.

Wires In most electrical circuits, input and output signals are transported to and from logic gates by conductive wires. A basic requirement of wires is that they have minimum electrical resistance so they can carry electrical signals with only minimal loss of energy. A wire in the context of this paper refers to a connection between two electrical nodes. It does not include any intervening electrical resistance intentionally added to it in order to alter or delay the electrical signal between the electrical nodes.

Memory Elements In the context of this paper, a memory element refers to a device that stores bits of information. Memory elements are employed in computer memories and in sequential circuits generally—circuits that involve clock signals in their operation. A memory element can possess more than one stable state. For example, a binary shift register contains four flip-flops and has 16 states, but each of its four memory elements has only two states.

Adder In the context of this paper, an adder is referred to as a digital circuit that performs addition on binary numbers.

Most Significant Bit In the context of this paper, the most significant bit refers to the bit in a binary number that is of the greatest numerical value.

Least Significant Bit In the context of this paper, the least significant bit refers to the bit in a binary number that is of the lowest numerical value.

Middle bit In the context of this paper, the middle bit refers to a bit in a binary number that is positioned between the least significant bit and the most significant bit.

Directly In the context of this paper, a direct connection, tie, etc. between two electrical node refers to an electrical path of minimum resistance and is without any intervening resistive element included by design to increase its resistance.

Chip In the context of this paper, a chip refers to a device made of interconnected electronic components, such as transistors and resistors, that are etched or imprinted onto a tiny slice of a semiconducting material, such as silicon or germanium.

SUMMARY OF THE INVENTION

The Inventors of this invention recognized that, in doing multiplication in an electronic device using, for example, the Booth methods, the two operands are often not generated contemporaneously and may even be generated at different parts of the device, and they may travel via different paths and arrive at the multiplication circuitry at different times. It slows down the multiplication operation when the device has to hold the early arrived operand in storage and waits for the arrival of the other operand to begin the multiplication operation. The waiting time is non-productive. And even the multiplier is a reoccurring number, the bit-by-bit operation must be repeated.

With the Blanz method and its progenies that commonly use a look-up-table in storing partial products, the LUT usually comprises a block of memory elements such as ROM, DRAM, SRAM, or FLASH EPROM. Inventors noticed that memory blocks take considerable IC space for the memory cells and the associated overhead circuitry such as address decoders. For volatile memories, the necessary refreshing circuitry further consumes IC space. And the memory circuit being sequential in nature involves a clock, which restrict the speed of operation.

One way to circumvent the IC space issue is to move the memory off chip. This multiple chip solution, however, carries speed penalty because the access and retrieval of the partial products from a remote LUT takes multiple dock cycles. Depending on the type of memory and architecture of the system, it may take, according to a report from Game Development Conference, upon to 75 system clock cycles for the CPU to retrieve data from a cache memory, and even hundreds of cycles to reach more remote system memory.

With this realization, the Inventors invented and disclosed in this paper multiplication apparatuses and methods, which can be implement in computers and other electronic devices with logic gates, with which to carry out multiplication operations of a number to a constant in as little as a couple of gate delays, which may be only a fraction of a single system clock cycle.

As will be explained in more detail later in this paper, one aspect of this invention is directed to methods of multiplication between a binary number and a constant. One exemplary method starts by providing a plurality of partial product generators (PPG), each of which is constructed with logic gates including at least one two-input AND gate and wires. The PPGs are configured to represent a constant multiplicand and are free of memory elements.

The method comprises a first step of grouping the binary number into non-overlapping sets of binary bits outside the PPG. Each individual bit set is then communicated to the input terminals of a PPG, which are directly wired to the logic gates. Each PPG operates on the binary bits and generates its partial product to a multiplicand represented by the circuitry of the logic gates and present the partial product at the output terminals of the PPG. The partial products from all PPGs are then added at an adder outside of the PPGs to arrive at the final product of the binary number and the multiplicand.

Another aspect of the invention is directed to methods of multiplication between a binary number and a constant in an integrated circuit chip where a plurality of PPGs as described above are aggregated in a common area, and the PPGs are either placed adjacent to each other, or distributed at disjoined locations in the integrated circuit chip.

In the methods, the step of grouping of the binary bits of the binary number into a plurality of sets occasionally may result in one set with fewer bit or bits than in the other sets. In such an event, the PPG that receives this short set will have fewer bits of input communicated to it. The vacancies may be supplemented with zero bits.

Inventors used two exemplary constants as multiplicands to illustrate this invention—the constant $\pi/2$ and the constant $1/\ln 2$—two irrational numbers often encountered in solving scientific and engineering problems. By following the examples, a skilled person will be able to repeat this invention on multiplications of a known constant number to any numbers in binary form.

Two examples will be described below to illustrate the multiplication of the constant $\pi/2$ to a binary number. In the first example, the PPGs are configured to receive two binary bits at its input terminals—a radix 8 implementation. In the second example, the PPGs are configured to receive three binary bits at its input terminals—a radix 8 implementation. In both examples, the most significant bit output from the PPGs is connected to a two-input AND gate and the AND gate's two input terminals are directly connected to two input terminals of the PPG.

Another two examples will illustrate the multiplication of the constant that is the reciprocal of the natural logarithm of 2 ($1/\ln 2$) to a binary number. Similar to the two example of $\pi/2$, in one example, the PPGs are configured to receive two binary bits at its input terminals—a radix 4 implementation; and in the second example, the PPGs are configured to receive three binary bits at its input terminals—a radix 8 implementation. In both examples, the most significant bit output from the PPGs is connected to a two-input AND gate and the two input terminals of the AND gate are directly connected to two input terminals of the PPG.

DETAILED DESCRIPTION OF EXEMPLARY EMBODIMENTS OF THE INVENTION

Example 1 Multiplication of Constant π/2 to a 16 Bit Random Number

Figure 1:
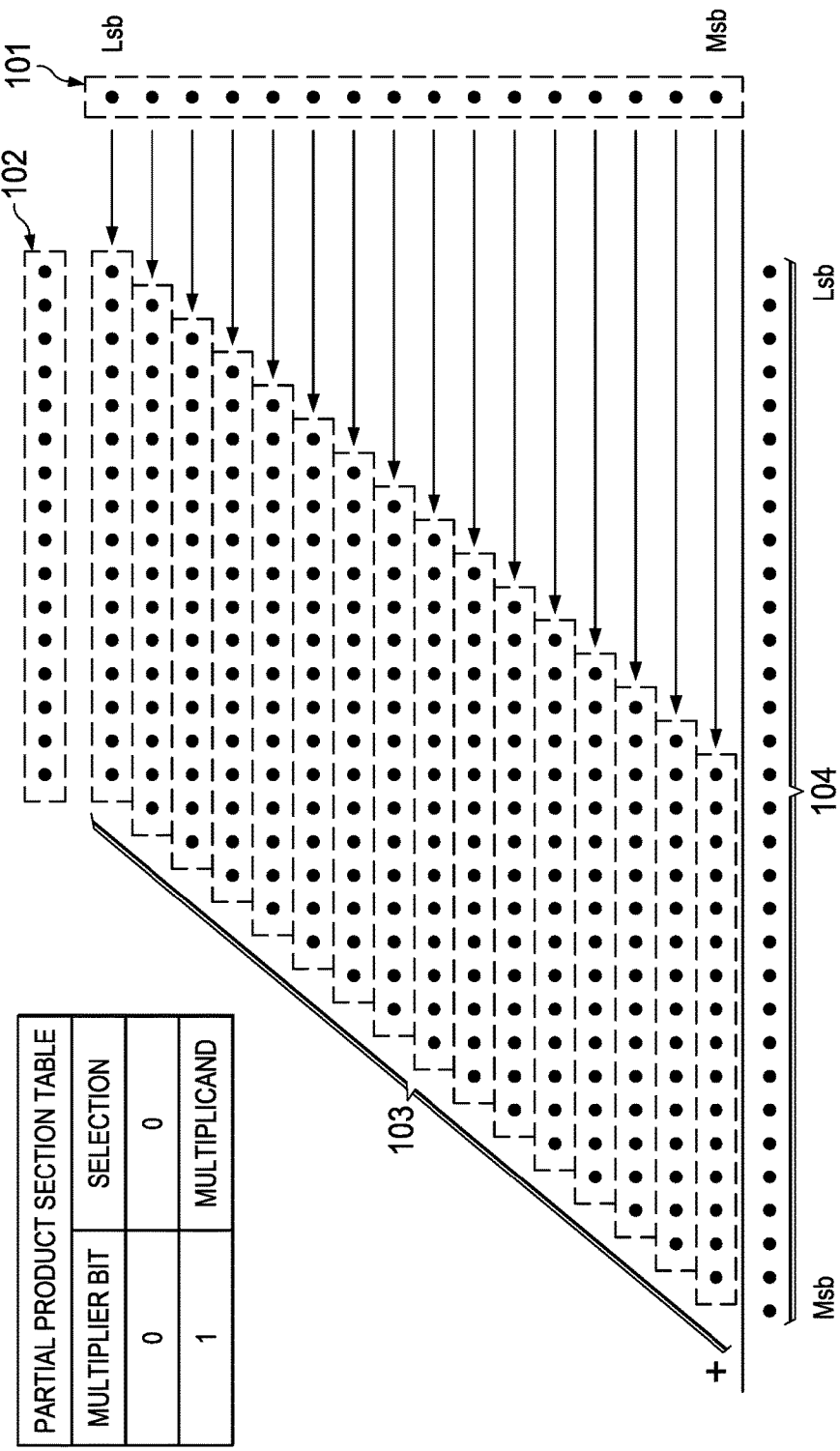
FIG. 1 depicts a multiplication of two 16-bit numbers in known art.
Figure 2:
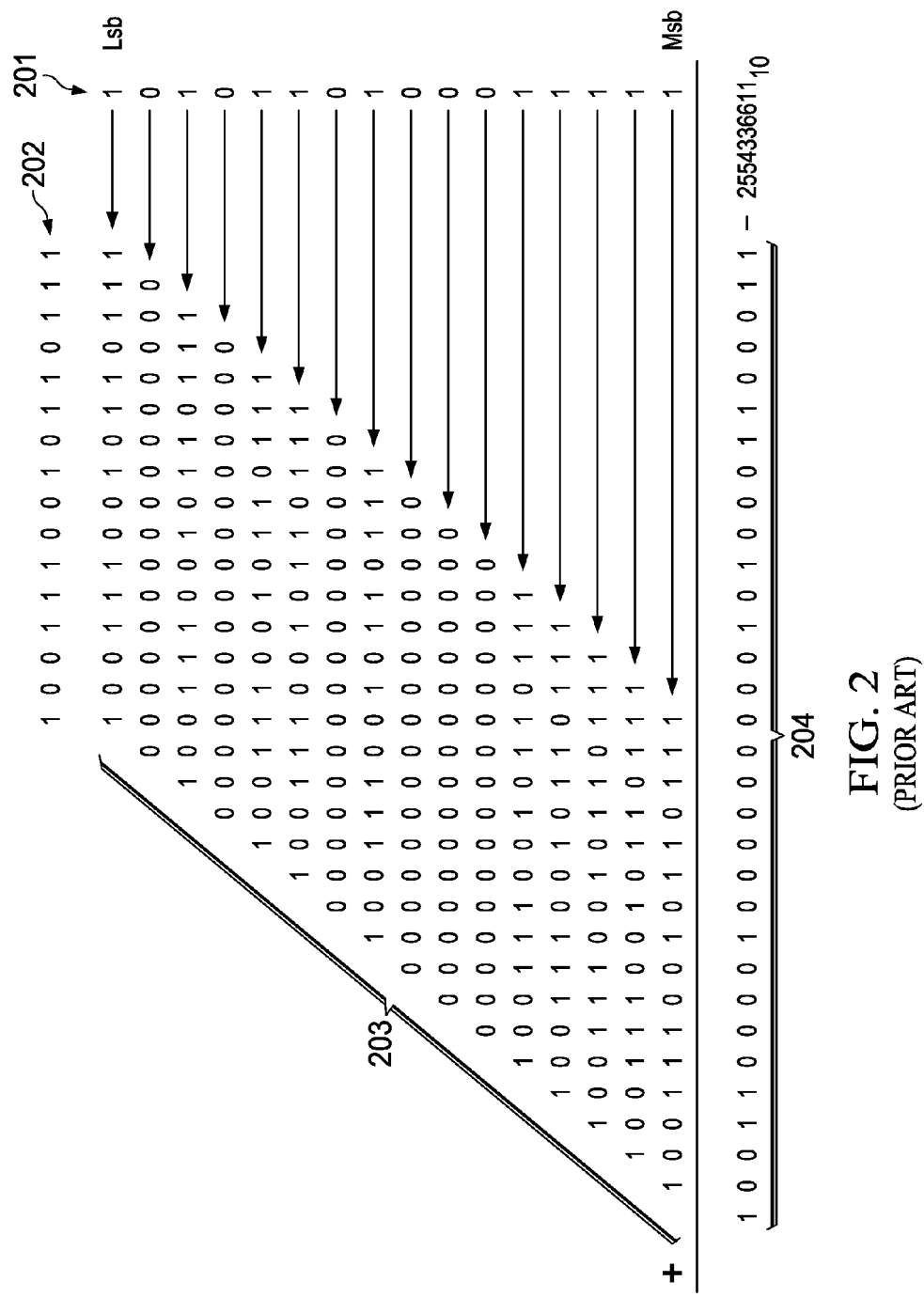
FIG. 2 depicts an example of the "shift and add" method in known art.
Figure 3:
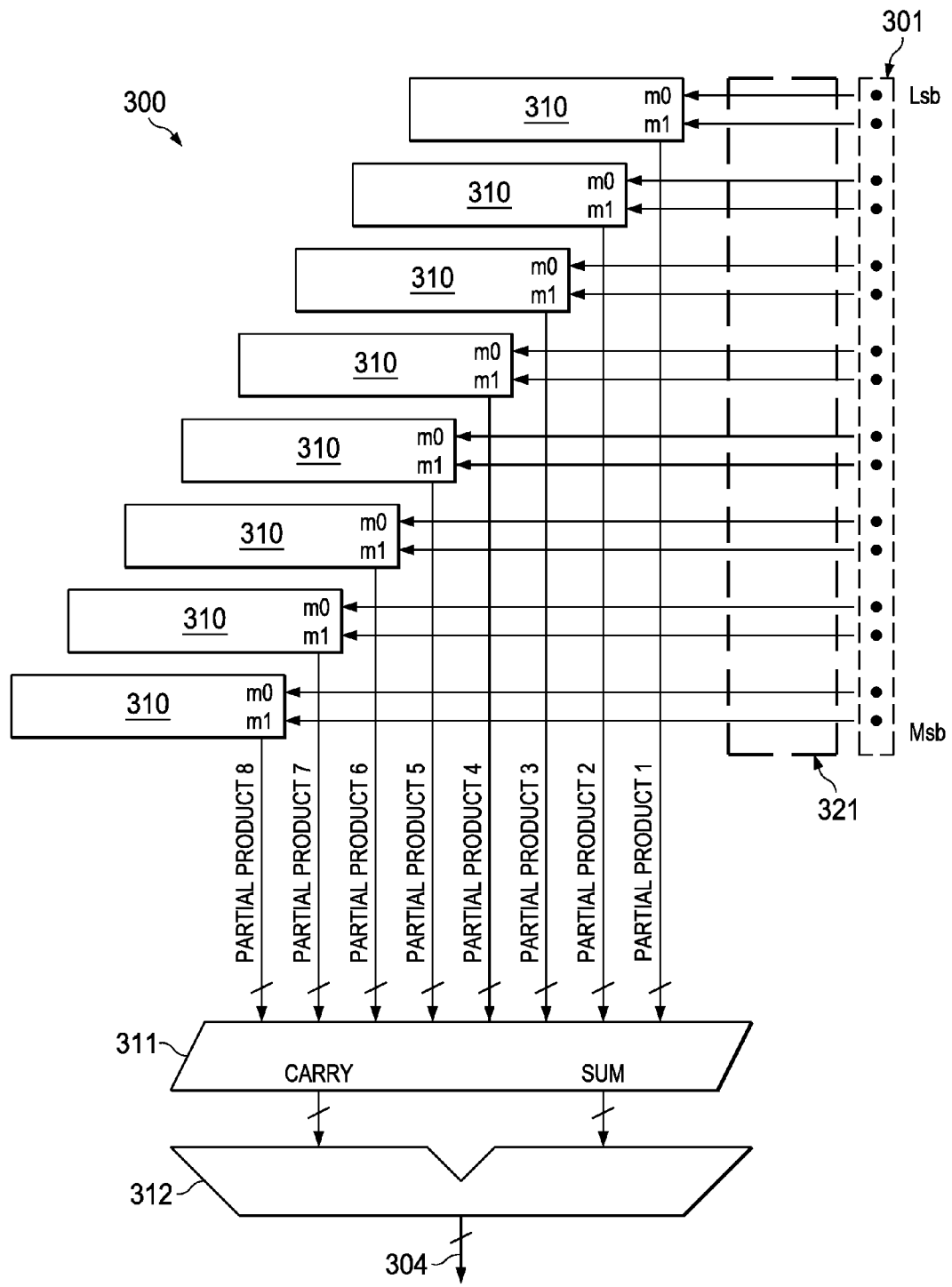
FIG. 3 depicts a block diagram illustrating a multiplication operation according to this invention.
Figure 4:
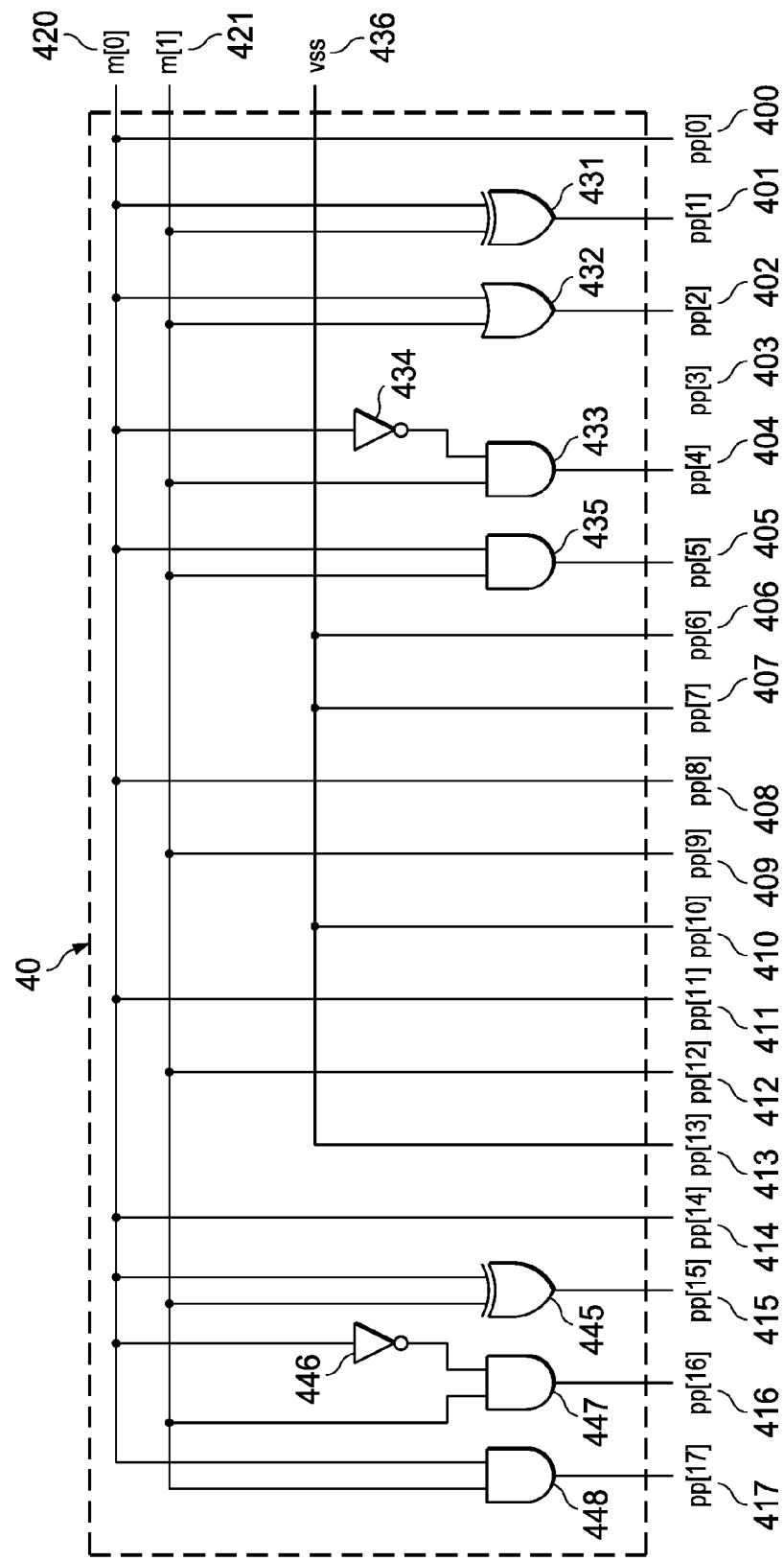
FIG. 4 depicts an example of a radix 4 partial product generator (PPG) for multiplying the constant π/2 according to this invention.

FIGS. 3 and 4 depict an exemplary embodiment of this invention, in which a constant is multiplied to a 16 bit number 301. The constant chosen for the illustrative embodiment is 1.57077, which is approximately one half of the irrational number π. In binary representation, the number may be expressed by an 18 bit binary number 00 1100 1001 0000 1111. If more precision is desired, the number of bit string in the representation may be lengthened.

The partial product generators PPGs 310 in this example are each configured with a 18-bit output terminal and a 2-bit input terminal—radix 4. This exemplary PPG may be constructed in a single integrated circuit chip with logic elements such as AND gates, OR gates, XOR gates, INVETERs, and wires, or it can be constructed with discrete logic components connected by wires.

In the following description, the notation pp[m] designates the $m^{th}$ of the 18 outputs of each PPG; and m[0] is the least significant bit and m[1] is the most significant bit of the 2-bit multiplier subsets.

The binary representation of the constant π/2 is 1.100100100001111. The partial products of π/2 and the two-bit binary numbers 00, 01, 10, and 11 are listed in the equations below in 18 bits:

$$11 \times \pi/2 = 1\ 0\ 0\ 1\ 0\ 1\ 1\ 0\ 1\ 1\ 0\ 0\ 1\ 0\ 1\ 1\ 0\ 1 \quad (1)$$

$$10 \times \pi/2 = 0\ 1\ 1\ 0\ 0\ 1\ 0\ 0\ 1\ 0\ 0\ 0\ 0\ 1\ 1\ 1\ 1\ 0 \quad (2)$$

$$01 \times \pi/2 = 0\ 0\ 1\ 1\ 0\ 0\ 1\ 0\ 0\ 1\ 0\ 0\ 0\ 0\ 1\ 1\ 1\ 1 \quad (3)$$

$$00 \times \pi/2 = 0\ 0\ 0\ 0\ 0\ 0\ 0\ 0\ 0\ 0\ 0\ 0\ 0\ 0\ 0\ 0\ 0\ 0 \quad (4)$$

FIG. 3 depicts the "shift and add" steps of the multiplication. In FIG. 3, the 16 bit multiplier 301 is figuratively arranged to the right edge and is grouped into 8 two-bit subsets. Unlike in the Booth method, the bits in each group do not overlap. The 16-bit multiplier is partitioned to eight 2-bit subsets. Each subset is communicatively coupled to a PPG (to be described in more detail below) via a m[0] and a m[1] terminal. In this embodiment, the 8 subsets of the multiplier are connected to 8 separate PPGs 310, which in an IC may be identically laid out, and the outputs of the eight PPGs are channeled directly to a carry-sum adder tree 311 and a final adder 312. The final product of the multiplication 304 is accessible from the final adder. In other implements, the subsets may be multiplexed so fewer PPGs are used to lower the hardware count at a cost of lengthier operation.

Referring to equations (1) through (4), it can be seen that the last bit of the equation (1) through (4) are 1, 0, 1, and 0 respectively, which represent the least significant bit of the partial products of π/2 and the numbers 11, 10, 01, and 00 respectively. These also represent the desired outputs of the least significant bit from all PPGs 310 to be delivered to the sum-carry adder 311 and is designated as output pp[0]. The other 17 outputs of the PPGs 310 are designated as pp[2] through pp[17] consecutively.

One exemplary construction of a PPG that can realize the results of equations (1) through (4) is depicted in FIG. 4.

As depicted in FIG. 4, the PPG has two input terminals 420 and 421 and 18 output terminals 400-417. The number of outputs from a PPG reflects on the precision by design. When high precision is needed, a skilled person may follow the teaching disclosed in this paper to design and build PPGs with 32, 64, 128, or even higher number of outputs.

In this 18 bit PPG, the first output pp[0] 400, which represents the least significant bit of multiplication is communicatively coupled (in this example, directly wired) to the least significant bit of the multiplier m[0] 420 so the output follows the value of m[0]: it outputs a 1 when the input from the multiplier value is 01 or 11.

Output number two pp[1] 401 is directly connected to the output terminal of a two-input XOR gate 431 of which the two input terminals are connected to least significant bit m[0] 420 and the most significant bit m[1] 421 of the multiplier respectively. It only outputs a 1 when the input from the multiplier value is 01 or 10 and otherwise a zero, and therefore it follows the output of the XOP gate of which the inputs are tied to m[0] and m[1].

Output pp[2] 402 and output pp[3] 403 are connected to the output terminal of an two-input OR gate 432 of which the two input terminals are connected to m[0] 420 and m[1] 421.

Output pp[4] 404 is connected to the output terminal of an two-input AND gate 433 of which one of the input terminals is connected to m[1] 421 and the other input terminal is connected to the output terminal of an INVERTER 434 of which the input is connected to m[0] 420.

Output pp[5] 405 is connected to the output terminal of an two-input AND gate 435 of which the two input terminals are connected to m[0] 420 and m[1] 421. Since the logic requirement of PP[5] 405 is identical to that of output pp[17] 407, this AND gate 435 may be shared by the pp[17] 417 so the two-input AND gate 448 may be saved.

Outputs pp[6] 406, pp[7] 407, pp[10] 410, and pp[13] 413 are connected to a voltage node Vss 436, which stands at ground potential and in this example represents a logic value of zero. Outputs pp[8] 408, pp[11] 411, and pp[14] 414 are connected to m[0] (420), which is the same input as for pp[0] 400.

Output pp[9] 409 is connected to m[1] 421, output pp[12] 412 is also connected to the same input m[1] 421. Output pp[15] 415 is connected to an XOR gate 445, the same as pp[1] 401; therefore it may share the same XOR gate 431 in order to save hardware cost.

Output pp[16] 416 is connected to the output terminal of a two-input AND gate 447 of which one of the input terminals is connected to m[1] 421 and the other input terminal is connected to the output terminal of an INVERTER 446. And the input of the inverter 446 is connected to m[0] 420. Output pp[16] may share the same logic elements as output pp[4] 404 because the logic requirement of the two outputs of the PPG are identical in this example.

The function of this exemplary PPG is to generate the partial products of the constant π/2 and the binary multipliers 00, 01, 10, and 11. The PPG is configured to have two input terminals to take the partitioned multiplier for the decoder and make the partial products available at the 18 output terminals.

When the multiplier is 00, m[0] and m[1] are zero, and all 18 output terminals are zero. When the multiplier is 01, pp[0], pp[1], pp[2], pp[3], pp[8], pp[11], pp[14], and pp[15] output logic one and the other terminals output logic zero. When the multiplier is 10, pp[1], pp[2], pp[3], pp[4], pp[9], pp[12], pp[15], and pp[6] output logic one and the other terminals output zero. When the multiplier is 11, pp[0], pp[2], pp[3], pp[5], pp[8], pp[9], pp[11], pp[12], pp[14], and pp[17] output logic one; and the other terminals output logic zero.

FIG. 4 depicts only one exemplary way of constructing a PPG with which the multiplication of constant π/2 and a two-bit multiplier can be realized. A person of ordinary skill in the art of computer engineering may arrange logic elements in other ways to yield the equivalent result. In the implementation depicted in FIG. 4, the time from when Input m[0] is impressed on the PPG to the time when pp[4] is available is only 2 gate delays (one AND gate and one INVERTER).

Example 2 Radix 8 Multiplication of Constant π/2 to a 16 Bit Number

The following example is implementation in radix 8 of the multiplication of the same constant π/2 to a 16-bit number. A person skilled in the art of computer science and engineering will appreciate how this implementation can reduce the number of PPGs with slightly more complex PPG construction and may follow the example in applying it to implementations using radices higher than 8.

Figure 5:
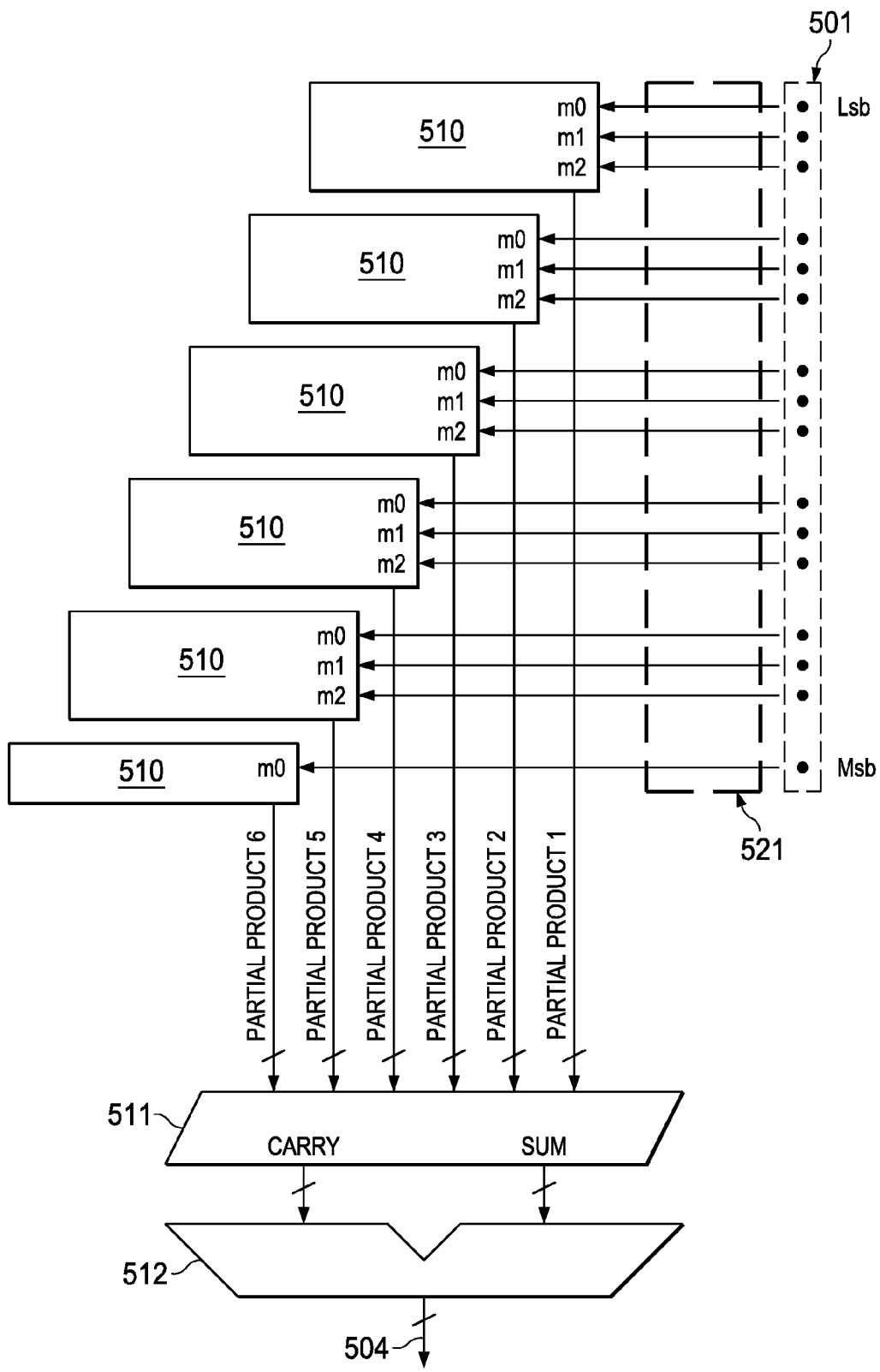
FIG. 5 depicts a block diagram illustrating another multiplication operation according to this invention.
Figure 6:
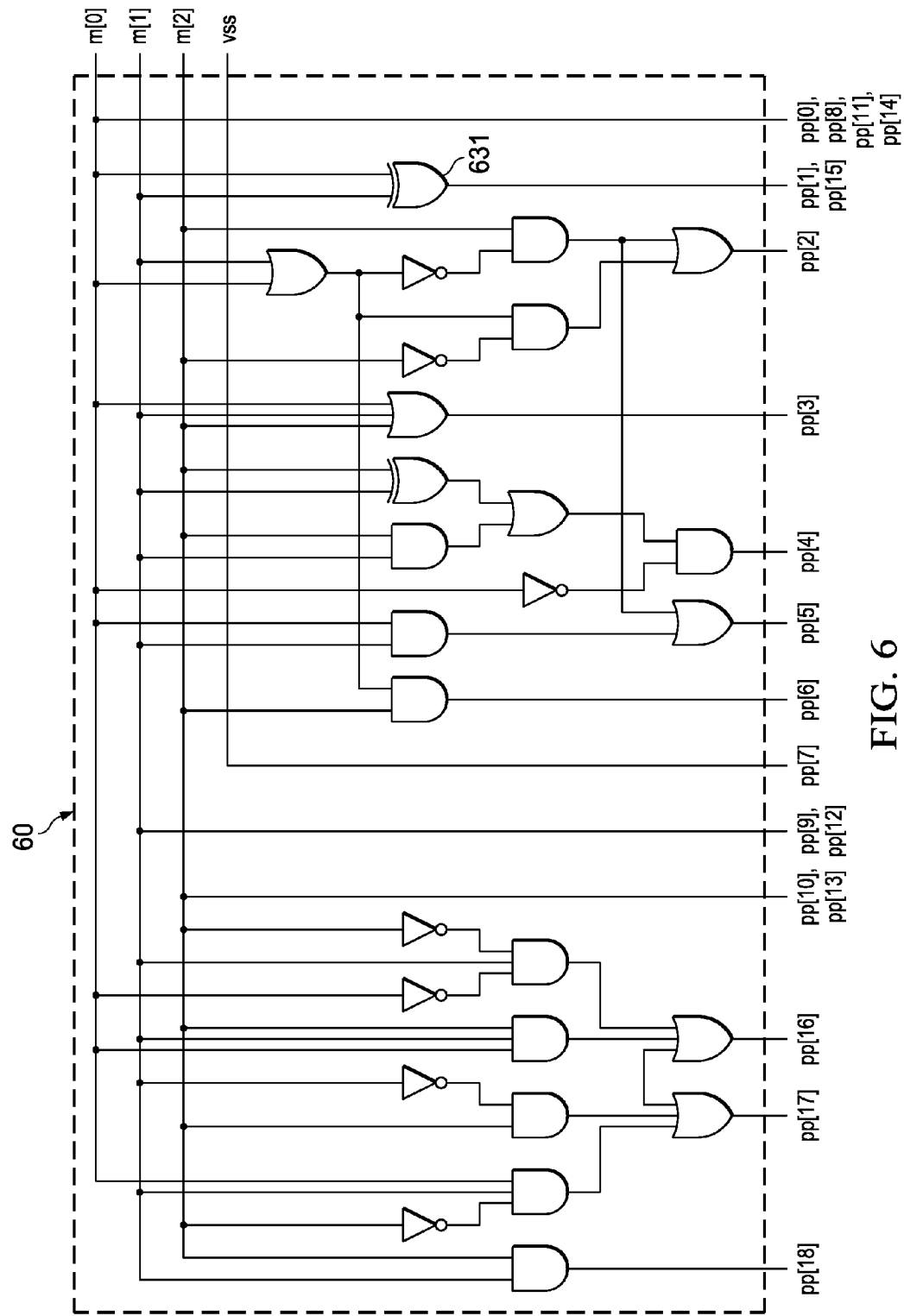
FIG. 6 depicts an example of a radix 8 partial product generator (PPG) for multiplying the constant π/2 according to this invention.

FIGS. 5 and 6 depict the illustrative embodiment, in which the constant π/2 is multiplied to a 16 bit random number 501 in radix 8. The difference between this embodiment and the one in example 2 is that the multiplier is grouped in three non-overlapping bits instead of two. Because the multiplier is a 16-bit number, the last sub-group after partition will only have one-bit—two bits fewer than the other sub-groups.

In FIG. 5, the partial product generator PPG 510 has 3-bit input and 19-bit output. Six PPGs are involved in this multiplication, as compared to eight PPGs in example 2. One PPG only receives, at its least significant bit input terminal the one-bit input from the one-bit sub-group of the multiplier and the other two inputs are tied at $V_{SS}$.

This exemplary PPG is also constructed with logic elements such as AND gates, OR gates, XOR gates, INVETERs, and wires. The notation pp[m] designates the $m^{th}$ of the 19 outputs of the PPG; and m[0] is the least significant bit, m[2] is the most significant bit of the 3-bit multiplier subsets, m[1] is the middle bit.

The binary representation of the constant π/2 is 1.100100100001111. The partial products of π/2 and the possible radix 8 binary numbers 000, 001, 010, 011, 100, 101, 110, and 111 are listed in the equations below:

$$111 \times \pi/2 = 1\ 0\ 1\ 0\ 1\ 1\ 1\ 1\ 1\ 1\ 1\ 0\ 1\ 1\ 0\ 1\ 0\ 0\ 1 \quad (5)$$

$$110 \times \pi/2 = 1\ 0\ 0\ 1\ 0\ 1\ 1\ 0\ 1\ 1\ 0\ 0\ 1\ 0\ 1\ 1\ 0\ 1\ 0 \quad (6)$$

$$101 \times \pi/2 = 0\ 1\ 1\ 1\ 1\ 1\ 0\ 1\ 1\ 0\ 1\ 0\ 1\ 0\ 0\ 1\ 0\ 1\ 1 \quad (7)$$

$$100 \times \pi/2 = 0\ 1\ 1\ 0\ 0\ 1\ 0\ 0\ 1\ 0\ 0\ 0\ 0\ 1\ 1\ 1\ 1\ 0\ 0 \quad (8)$$

$$011 \times \pi/2 = 0\ 1\ 0\ 0\ 1\ 0\ 1\ 1\ 0\ 1\ 1\ 0\ 0\ 1\ 0\ 1\ 1\ 0\ 1 \quad (9)$$

$$010 \times \pi/2 = 0\ 0\ 1\ 1\ 0\ 0\ 1\ 0\ 0\ 1\ 0\ 0\ 0\ 0\ 1\ 1\ 1\ 1\ 0 \quad (10)$$

$$001 \times \pi/2 = 0\ 0\ 0\ 1\ 1\ 0\ 0\ 1\ 0\ 0\ 1\ 0\ 0\ 0\ 0\ 1\ 1\ 1\ 1 \quad (11)$$

$$000 \times \pi/2 = 0\ 0\ 0\ 0\ 0\ 0\ 0\ 0\ 0\ 0\ 0\ 0\ 0\ 0\ 0\ 0\ 0\ 0\ 0 \quad (12)$$

FIG. 5 depicts the "shift and add" steps of the multiplication between the constant π/2 and a 16 bit number using radix 8 PPGs.

In FIG. 5, the 16 bit multiplier 501 is arranged figuratively to the right and is grouped into five 3-bit subsets and one single bit subset. Each subset is connected to a PPG via a m[0] a m[1], and a m[2] connection. The single bit subset may be connected to a PPG of one-bit input or a three-bit input with m[1] and m[2] fixed at Vss. In this embodiment, each subset of the multiplier is connected to a separate and maybe identical PPG 510 and the 19-bit outputs of the eight PPGs are channeled directly to a carry-sum adder tree 511 and a final adder 512. The final product of the multiplication 504 is then accessible from the final adder 512. In other implements, the subsets may be multiplexed to a smaller number of PPGs at a lower hardware count and maybe lessor performance.

Referring to equations (5) through (12), it can be seen that the last bit of the equation (5) through (12) are 1, 0, 1, 0, 1, 0, 1, and 0 respectively, which represent the least significant bit of the partial products of π/2 and the numbers 111, 110, 101, 100, 011, 010, 001 and 000 respectively. These also represent the desired outputs of the least significant bit from all PPGs 510 to be delivered to the sum-carry adder 511 and is designated as output pp[0]. The other outputs of the PPGs 510 are designated as pp[1] through pp[18] consecutively.

One possible configuration the PPG may have that can realize the results of equations (5) through (12) is depicted in FIG. 6 as follows:

Outputs pp[0], pp[8], pp[11], and pp[14] are directly connected to the least significant bit of the multiplier m[0]. This output outputs a 1 when the LSB of the multiplier sub-set is 1, and 0 when the LSB is 0; thus pp[8], pp[11], and pp[14] has the same as the logic value of m[0].

Outputs pp[1] and pp[5] are connected to the output terminal of a two-input XOR gate 631 of which the two input terminals are connected to m[0] and m[1]. Referring to equation (5) through (12), it can be seen that the output bits [1] and [5] from all PPGs 510 should output a 1 only when m[0] and m[1] do not have the same value, regardless of m[2]. PP[18], the MSB of the PPD, is directly connected to the output terminal of a two-input AND gate of which the two inputs are directly connected to m[1] and m[2].

A person with ordinary skill in the art of computer science and engineering can follow the logic diagram of FIG. 6 to understand and to reproduce a PPG that efficiently performs the multiplication of the constant π/2 to a random 16 bit number. If higher precision than 18 bits is needed, the PPG can be expanded to include more circuitry based on the teaching in this paper. In the implementation depicted in FIG. 6, the time from when input m[0] is impressed on the PPG to the time when pp[2] is available is only 4 gate delays (two OR gates, one AND gate and one INVERTER).

Example 3 Multiplication of Constant 1/Ln 2 to a 16 Bit Binary Number

Figure 7:
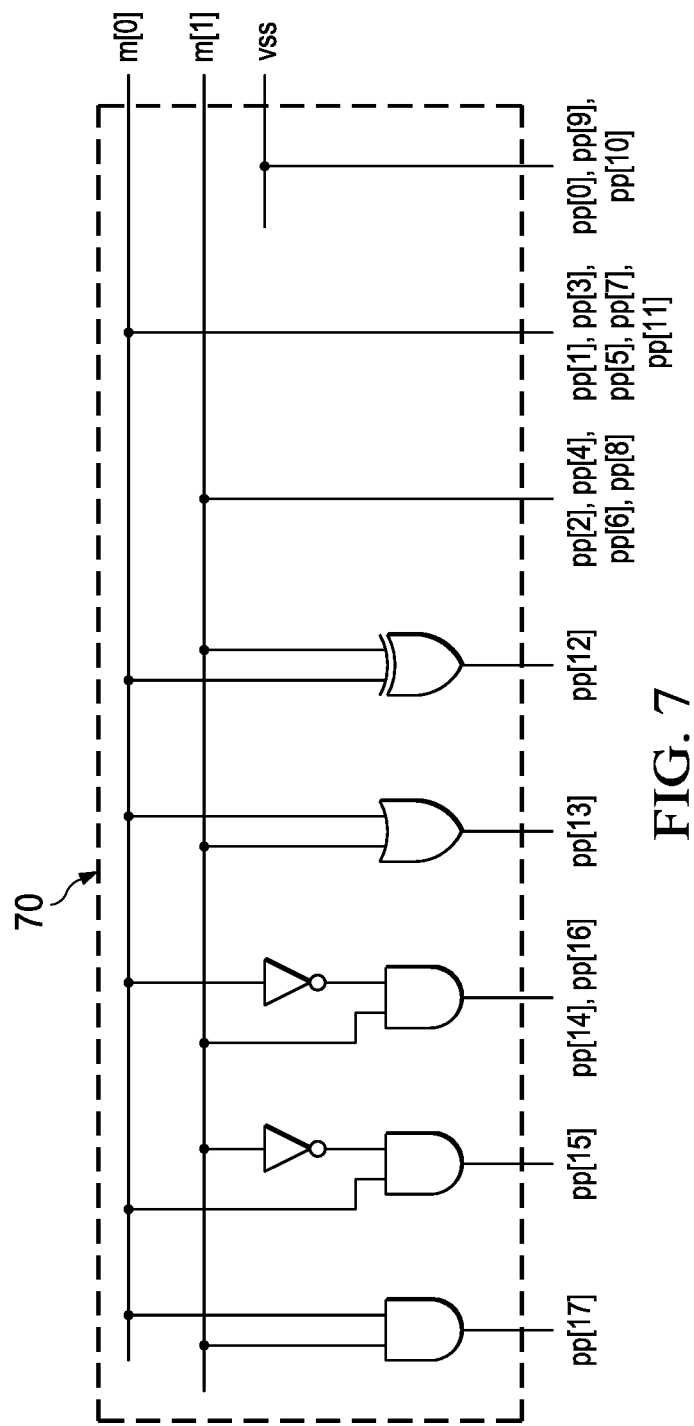
FIG. 7 depicts an example of a radix 4 partial product generator (PPG) for multiplying the constant 1/ln 2 according to this invention.

The constant 1/ln 2—the reciprocal of the natural logarithm of 2—is another constant frequently encountered in modern computer science and engineering. FIG. 7 depicts an illustrative embodiment of a PPG that implements the multiplication of this constant and a random number. In decimal representation 1/ln 2 equals 1.4426; and in 18 bit binary representation it is 00 1100 1001 0000 1111.

FIG. 7 depicts one possible construction of a PPG for multiplying 1/ln 2. The PPG may be constructed in a single integrated circuit chip with AND gates, OR gates, XOR gates, INVETERs, and wires, or with discrete components. Similar to the previous examples, the notation pp[m] designates the $m^{th}$ of the 18 outputs of the PPG; and m[0] is the least significant bit and m[1] is the most significant bit of the 2-bit multiplier subsets.

The partial products of 1/ln 2 and the two-bit binary numbers 00, 01, 10, and 11 are listed in the equations below:

$$11 \times 1/\ln 2 = 1\ 0\ 0\ 0\ 1\ 0\ 0\ 0\ 1\ 1\ 1\ 1\ 1\ 1\ 1\ 1\ 1\ 0 \quad (13)$$

$$10 \times 1/\ln 2 = 0\ 1\ 0\ 1\ 1\ 1\ 0\ 0\ 0\ 1\ 0\ 1\ 0\ 1\ 0\ 1\ 0\ 0 \quad (14)$$

$$01 \times 1/\ln 2 = 0\ 0\ 1\ 0\ 1\ 1\ 1\ 0\ 0\ 0\ 1\ 0\ 1\ 0\ 1\ 0\ 1\ 0 \quad (15)$$

$$00 \times 1/\ln 2 = 0\ 0\ 0\ 0\ 0\ 0\ 0\ 0\ 0\ 0\ 0\ 0\ 0\ 0\ 0\ 0\ 0\ 0 \quad (16)$$

FIG. 3 described previously also depicts the "shift and add" steps of the multiplication between the constant 1/ln 2 and a 16 bit number using radix 4 PPGs.

In FIG. 3, the 16 bit multiplier 301 is figuratively arranged to the right edge and is grouped into 8 two-bit subsets. Each subset is connected to a PPG (to be described in more detail below) via a m[0] and a m[1] connection. In this embodiment, each subset of the multiplier is connected to a separate PPG 310 and the outputs at the output terminals of the eight PPGs are channeled directly to a carry-sum adder tree 311 and a final adder 312. The final product of the multiplication 304 is then accessible from the final adder. In other implements, the subsets may be multiplexed to a smaller number of PPGs for lower hardware count and maybe lessor performance.

Referring to equations (13) through (16), it can be seen that the last bit of the equation (13) through (16) are all 0s, which represent the least significant bit of the partial products of 1/ln 2 and the numbers 11, 10, 01, and 00. The all zero string also represents the desired outputs of the least significant bit from all PPGs 310 to be delivered to the sum-carry adder 311 at output terminal pp[0]. The other outputs of the PPGs 310 are designated as pp[1] through pp[17] consecutively.

One possible way to construct the PPG with logic elements that can realize the results of equations (13) through (16) is depicted in FIG. 7.

From equation (13) through (16) it can be observed that output pp[0] is a null output, also are pp[9] and pp[10]. This can be accomplished by tying these outputs directly to Vss. Outputs pp[1], pp[3], pp[5], pp[7], and pp[11] can be observed as follow the logic value of m[0] so in the PPG, these outputs can be directly wired to the input m[0]. Outputs pp[2], pp[4], pp[6], and pp[8] follow the logic value of m[1] and thus can be constructed by directly wiring these outputs to input terminal m[1]. Output at pp[12] is a 1 only when input at m[0] and m[1] are not both 1 or 0 so it can be built with a XOR gate with one [input wired to m[0] and the other input wired to m[1]. Output at pp[17] is directly tied to a two-input AND gate with its two input tied directly to m[0] and m[1].

For brevity, the construction of the remaining outputs pp[13] through pp[16] is not described but it can be gleaned from observing equations (13) through (16) and by following FIG. 7. If a precision higher than 18 bits is needed, a skilled person should be able to expand the PPG following the teaching in this paper. In this implementation, the longest route from the input to the output of the PPG only takes 2 logic gate delays (one AND gate and one INVERT.)

Example 4 a Radix 8 Multiplication of Constant 1/Ln 2 to a 16 Bit Number

The following example is a radix 8 implementation of the same multiplication of the constant 1/ln 2 to a 16-bit number. A person skilled in the art of computer science and engineering will appreciate how this implementation can reduce the number of PPGs with slightly more complex PPG construction and may follow the invention herein described in applying it to implementations using radices higher than 8.

Figure 8:
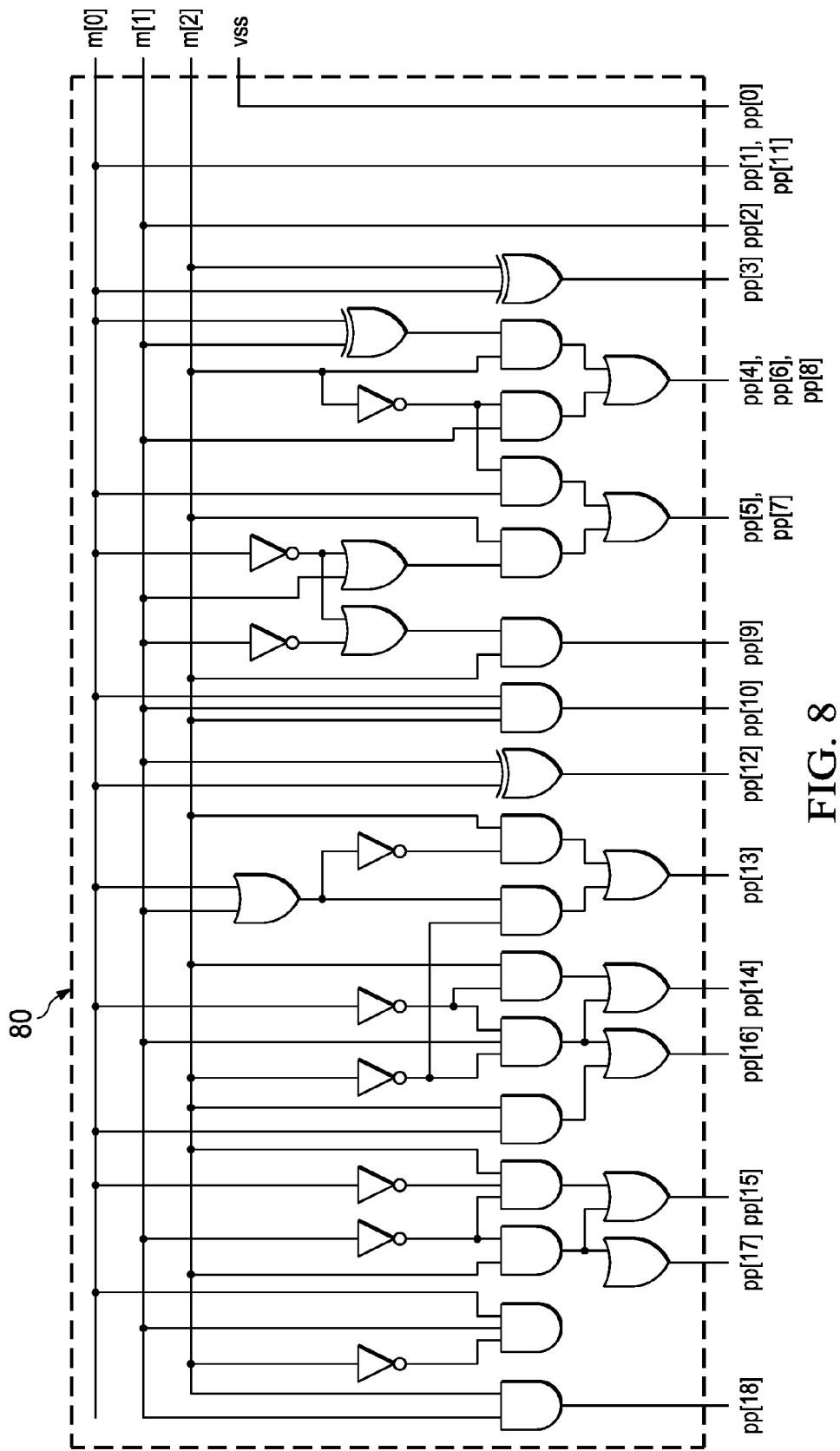
FIG. 8 depicts an example of a radix 8 partial product generator (PPG) for multiplying the constant 1/ln 2 according to this invention.

FIGS. 5 and 8 depict another illustrative embodiment of this invention, in which the constant 1/ln 2 is multiplied to a 16 bit decoded number 501 in radix 8 so the multiplier is grouped in three bits instead of two as in example 3. Because the multiplier is a 16-bit number, the last subset will only have one-bit—two bits fewer than in the other subsets.

In FIG. 5, the partial product generator PPG 510 is configured with 3 input terminals and 19 output terminals.

This exemplary PPG is also constructed with AND gates, OR gates, XOR gates, INVETERs, and wires in a single integrated circuit chip. The notation pp[m] designates the $m^{th}$ of the 19 outputs of the PPG; and m[0] is the least significant bit, m[2] is the most significant bit, and m[1] is the middle bit of the 3-bit multipliers respectively.

The binary representation of the constant 1/ln 2 is 1.011100010101010. The partial products of 1/ln 2 and the three-bit binary numbers 000, 001, 010, 011, 100, 101, 110, and 111 are listed in the equations below:

$$111 \times 1/\ln 2 = 1\ 0\ 1\ 0\ 0\ 0\ 0\ 1\ 1\ 0\ 0\ 1\ 0\ 1\ 0\ 0\ 1\ 1\ 0 \quad (17)$$

$$110 \times 1/\ln 2 = 1\ 0\ 0\ 0\ 1\ 0\ 1\ 0\ 0\ 1\ 1\ 1\ 1\ 1\ 1\ 1\ 1\ 0\ 0 \quad (18)$$

$$101 \times 1/\ln 2 = 0\ 1\ 1\ 1\ 0\ 0\ 1\ 1\ 0\ 1\ 1\ 0\ 1\ 0\ 1\ 0\ 0\ 1\ 0 \quad (19)$$

$$100 \times 1/\ln 2 = 0\ 1\ 0\ 1\ 1\ 1\ 0\ 0\ 0\ 1\ 0\ 1\ 0\ 1\ 0\ 1\ 0\ 0\ 0 \quad (20)$$

$$011 \times 1/\ln 2 = 0\ 1\ 0\ 0\ 0\ 1\ 0\ 1\ 0\ 0\ 1\ 1\ 1\ 1\ 1\ 1\ 1\ 1\ 0 \quad (21)$$

$$010 \times 1/\ln 2 = 0\ 1\ 0\ 0\ 1\ 1\ 1\ 0\ 0\ 0\ 1\ 0\ 1\ 0\ 1\ 0\ 1\ 0\ 0 \quad (22)$$

$$001 \times 1/\ln 2 = 0\ 0\ 0\ 1\ 0\ 1\ 1\ 1\ 0\ 0\ 0\ 1\ 0\ 1\ 0\ 1\ 0\ 1\ 0 \quad (23)$$

$$000 \times 1/\ln 2 = 0\ 0\ 0\ 0\ 0\ 0\ 0\ 0\ 0\ 0\ 0\ 0\ 0\ 0\ 0\ 0\ 0\ 0\ 0 \quad (24)$$

FIG. 5 depicts the "shift and add" steps of the multiplication between the constant 1/ln 2 and a 16 bit binary number using radix 8 PPGs.

In FIG. 5, the 16 bit multiplier 501 is arranged figuratively to the right and is grouped into five 3-bit subsets and one single-bit subset. Each subset is connected to a PPG via a m[0], a m[1], and a m[2] connection. The single bit subset may be connected to a PPG of one-bit input or a three-bit input with m[1] and m[2] fixed at Vss. In this embodiment, each subset of the multiplier is connected to a separate and maybe identical PPG 510 and the 19-bit outputs of the eight PPGs are channeled directly to a carry-sum adder tree 511 and a final adder 512. The final product of the multiplication 504 is then accessible from the final adder 512. In other implements, the subsets may be multiplexed to a smaller number of PPGs at a lower hardware count and maybe lessor performance.

Referring to equations (17) through (24), it can be seen that the last bits of the equation (17) through (24) are all zero, which represent the least significant bit of the partial products of 1/ln 2 and the numbers 111, 110, 101, 100, 011, 010, 001 and 000 respectively. These also represent the desired outputs of the least significant bit from all PPGs 510 to be delivered to the sum-carry adder 511 and is designated as output pp[0]. The other outputs of the PPGs 510 are designated as pp[1] through pp[18] consecutively.

One possible way to construct the PPG with logic elements that can realize the results of equations (17) through (24) is depicted in FIG. 8.

From equations (17) through (24) it can be observed that the LSBs of all partial products are zero. This leads to a simple construction of output pp[0], i.e., directly wiring of output pp[0] terminal to Vss, as depicted in FIG. 8. One can further observe that outputs pp[1] and pp[11] follow the logic value of m[0]; and the output pp[2] follows the value of m[1]. Therefore the PPG can be constructed by directly wiring the respective input terminals to the output terminals.

Output pp[3] and output pp[12] can be constructed each with a single XOR gate wired to m[0], m[2] and m[0], m[1] respectively, as depicted in FIG. 8. Output pp[18] can be tied directly to the output terminal of a two-input ADD gate with its two inputs died directly to m[1] and m[2]. From FIG. 8, one can observe that the longest route from the input to the output of the PPG is only 4 logic gate delays.

Following the explanation, a person with ordinary skill in computer engineering can readily complete a PPG depicted in FIG. 8 following the teaching in this paper and the drawing figure, and also expand the PPG if precision higher than 19 bit is needed.

As a skilled person will understand following the teaching in this paper that the time for the input signals communicated to a PPG take only a few gate delays to reach the output terminals of the PPG. Based on current computer architecture, this length of the time is at least one order shorter than one clock cycle of the usual system clock. Therefore, the time required to perform a multiplication can be reduced by several orders.

We claim:

1. A method of multiplying a binary number and a constant $\pi/2$ or $1/\ln 2$, comprising:
    grouping the binary number into a plurality of non-overlapping sets of two binary bits, each set including a most significant bit (MSB) and a least significant bit (LSB);
    communicating each set of binary bits as input bits to a separate two-input partial product generator of logic gates and wires connecting the logic gates including a two-input AND gate but free of memory elements, and output terminals,
    the communicating step including communicating the LSB and the MSB of the binary bits directly to the two input terminals of the AND gate;
    generating in each partial product generator a partial product of the constant and the number represented by the two binary bits, including an MSB at an output terminal of the two-input AND gate; and
    adding the partial products in an adder to generate the product of the binary number and the constant.

2. A method of multiplying a binary number and a constant $\pi/2$ or $1/\ln 2$, comprising:
    grouping the binary number into a plurality of non-overlapping sets of three binary bits each set including a most significant bit (MSB) and a middle bit and a least significant bit (LSB);
    communicating each set of binary bits as input bits to a separate three-input partial product generator of logic gates and wires connecting the logic gates including a two-input AND gate but free of memory elements, and output terminals,
    the communicating step including communicating the MSB and the middle bit of the binary bits directly to the two input terminals of the AND gate;
    generating in each partial product generator a partial product of the constant and the number represented by the three binary bits, including an MSB at an output terminal of the two-input AND gate; and
    adding the partial products in an adder to generate the product of the binary number and the constant.

3. An integrated circuit chip for multiplying a binary number to a constant $\pi/2$ or $1/\ln 2$, comprising:
    a plurality of partial product generators having two input terminals and output terminals including a MSB output terminal for a most significant output bit;
    the two input terminals configured to receive a portion of the binary number in the form of a two-bit binary number including a most significant bit (MSB) and a least significant bit (LSB);
    each partial product generator further comprising logic gates including a two-input AND gate and wires connecting the logic gates but free of memory elements;
    the logic gates and wires configured to generate a partial product of the two-bit binary number and a constant $\pi/2$ or $1/\ln 2$, and to present the partial product at the output terminals; and
    the two input terminals of the two-input AND gate configured to receive directly the MSB and the LSB from the two input terminals and to present an output to the MSB output terminal.

4. An integrated circuit chip for multiplying a binary number to a constant $\pi/2$ or $1/\ln 2$, comprising:
    a plurality of partial product generators having three input terminals and output terminals including a MSB output terminal for a most significant output bit;
    the three input terminals configured to receive a portion of the binary number in the form of a three-bit binary number including a most significant bit (MSB) and a middle bit and a least significant bit (LSB);
    each partial product generator further comprising logic gates including a two-input AND gate and wires connecting the logic gates but free of memory elements;
    the logic gates and wires configured to generate a partial product of the three-bit binary number and a constant $\pi/2$ or $1/\ln 2$, and to present the partial product at the output terminals; and
    the two input terminals of the two-input AND gate configured to receive directly the MSB and the middle bit from the three input terminals and to present an output to the MSB output terminal.

5. The integrated circuit chip of claim 3 or claim 4, in which the partial product generator is configured to generate a partial product within a system clock cycle.

* * * * *